United States Patent
Liu et al.

(10) Patent No.: US 10,998,897 B2
(45) Date of Patent: May 4, 2021

(54) POWER SWITCH OVER CURRENT PROTECTION SYSTEM

(71) Applicant: NXP B.V., Eindhoven (NL)

(72) Inventors: Xiaoqun Liu, Chandler, AZ (US); Madan Mohan Reddy Vemula, Tempe, AZ (US)

(73) Assignee: NXP B.V., Eindhoven (NL)

( * ) Notice: Subject to any disclaimer, the term of this patent is extended or adjusted under 35 U.S.C. 154(b) by 210 days.

(21) Appl. No.: 16/171,012

(22) Filed: Oct. 25, 2018

(65) Prior Publication Data
US 2020/0136601 A1   Apr. 30, 2020

(51) Int. Cl.
*H03K 17/082* (2006.01)
*H03K 17/693* (2006.01)
*H03K 17/687* (2006.01)
*H03K 17/567* (2006.01)
*H03K 17/081* (2006.01)
*H02H 9/02* (2006.01)

(52) U.S. Cl.
CPC ....... *H03K 17/0822* (2013.01); *H03K 17/082* (2013.01); *H02H 9/02* (2013.01); *H03K 17/08104* (2013.01); *H03K 17/567* (2013.01); *H03K 17/687* (2013.01); *H03K 17/6871* (2013.01); *H03K 17/693* (2013.01)

(58) Field of Classification Search
USPC .................................... 361/86–87, 93.7–93.9
See application file for complete search history.

(56) References Cited

U.S. PATENT DOCUMENTS

| | | | |
|---|---|---|---|
| 2006/0250738 A1* | 11/2006 | Hussein | H02H 9/001 361/93.1 |
| 2010/0007216 A1* | 1/2010 | Chojecki | H03K 17/0822 307/115 |
| 2015/0263514 A1* | 9/2015 | Koishi | H02M 1/08 361/93.7 |
| 2017/0179941 A1* | 6/2017 | Desel | H01L 27/088 |
| 2019/0028096 A1* | 1/2019 | Lee | H03K 17/168 |
| 2020/0119540 A1* | 4/2020 | Buhari | H02H 3/16 |

OTHER PUBLICATIONS

Lu, Kuan-Yi et al., "Design of Over-current Protection Circuit for Power Transistors", IEEE International Conference on Consumer Electronics—Taiwan, pp. 1-2. (2016).
Mo, Yongsea et al; "Design of a 5V-Output Boost DC-DC Converter with Improved Protection Functions for Battery-Operated Devices", 2017 IEEE International Conference on System Science and Engineering (ICSEE, pp. 757-760. (2017).

* cited by examiner

*Primary Examiner* — Danny Nguyen

(57) ABSTRACT

A power switch over current protection system including a power switch transistor configured to deliver a power current from a power source to power load, a power switch driver configured to control and on/off state of the power switch, an over current protection (OCP) circuit to detect a threshold value of the power current, a discharge transistor configured to discharge a parasitic capacitance of the power switch transistor, and a system state machine to receive a signal from the OCP circuit configured to control an action of the power switch driver and discharge transistor depending on the level of the power current.

23 Claims, 3 Drawing Sheets

POWER SWITCH OVER CURRENT PROTECTION SYSTEM

TECHNICAL FIELD

Various exemplary embodiments disclosed herein relate to over current protection (OCP), and more particularly to a power switch OCP system with soft shutdown mechanism to avoid inductance kick back.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include a power switch over current protection system, including a power switch transistor configured to deliver a power current from a power source to power load, a power switch driver configured to control and on/off state of the power switch, an over current protection (OCP) circuit to detect a threshold value of the power current, a discharge transistor configured to discharge a parasitic capacitance of the power switch transistor, and a system state machine to receive a signal from the OCP circuit configured to control an action of the power switch driver and discharge transistor depending on the level of the power current.

The OCP circuit may trigger an over current event when the power current is higher than a predetermined threshold.

The system state machine may be configured to soft shut down the power switch transistor when the power current is higher than a predetermined threshold. The system may also include an electrostatic discharge (ESD) protection circuit disposed between the power source and the power switch transistor, wherein the soft shutting down of the power switch transistor protects the ESD protection circuit.

The system state machine may turn on the discharge transistor and turns off the power switch driver when the power current is higher than a predetermined threshold.

The system state machine may turn off the discharge transistor and turns on the power switch driver when the power current is lower than a predetermined threshold.

The over current protection circuit may be in parallel with the power switch transistor.

The system state machine may be in series with the over current protection circuit.

The power switch transistor may be an extended drain transistor.

The discharge transistor may be an extended drain transistor.

The system may include a current mirror configured to isolate a gate voltage of the power switch transistor from an output voltage of the power switch transistor. One transistor of the current mirror may be directly connected to the gate of the power switch transistor.

Embodiments also include a method including detecting a charging current entering a power switch transistor, determining whether a level of the charging current exceeds a predetermined threshold, signaling to a system state machine by an over current protection circuit a status of the charging current, turning on a discharge transistor when the charging current exceeds the predetermined threshold, and soft shutting off a power switch transistor to protect electronic circuits that are connected to the power switch transistor.

A decreasing rate of a gate voltage of the power switch transistor may be calculated by the equation $dV_{gate}/dt = I_{discharge}/C$, where Idischarge is a discharge current, and C is a parasitic capacitance of the power switch transistor.

The method may include switching on a discharge transistor while switching off a power switch driver that drives the power switch transistor.

The method may include controlling an on state of a power switch transistor using a power switch driver.

The method may include controlling an on state of the power switch driver using the system state driver.

The protected electronic circuits may include an ESD protection circuit.

A gate voltage of the power switch transistor may be isolated from an output voltage of the power switch transistor using a current mirror.

The power switch transistor may be configured to soft shut down in response to unplugging and plugging of a power cable to reduce kick back inductance in the power cable.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
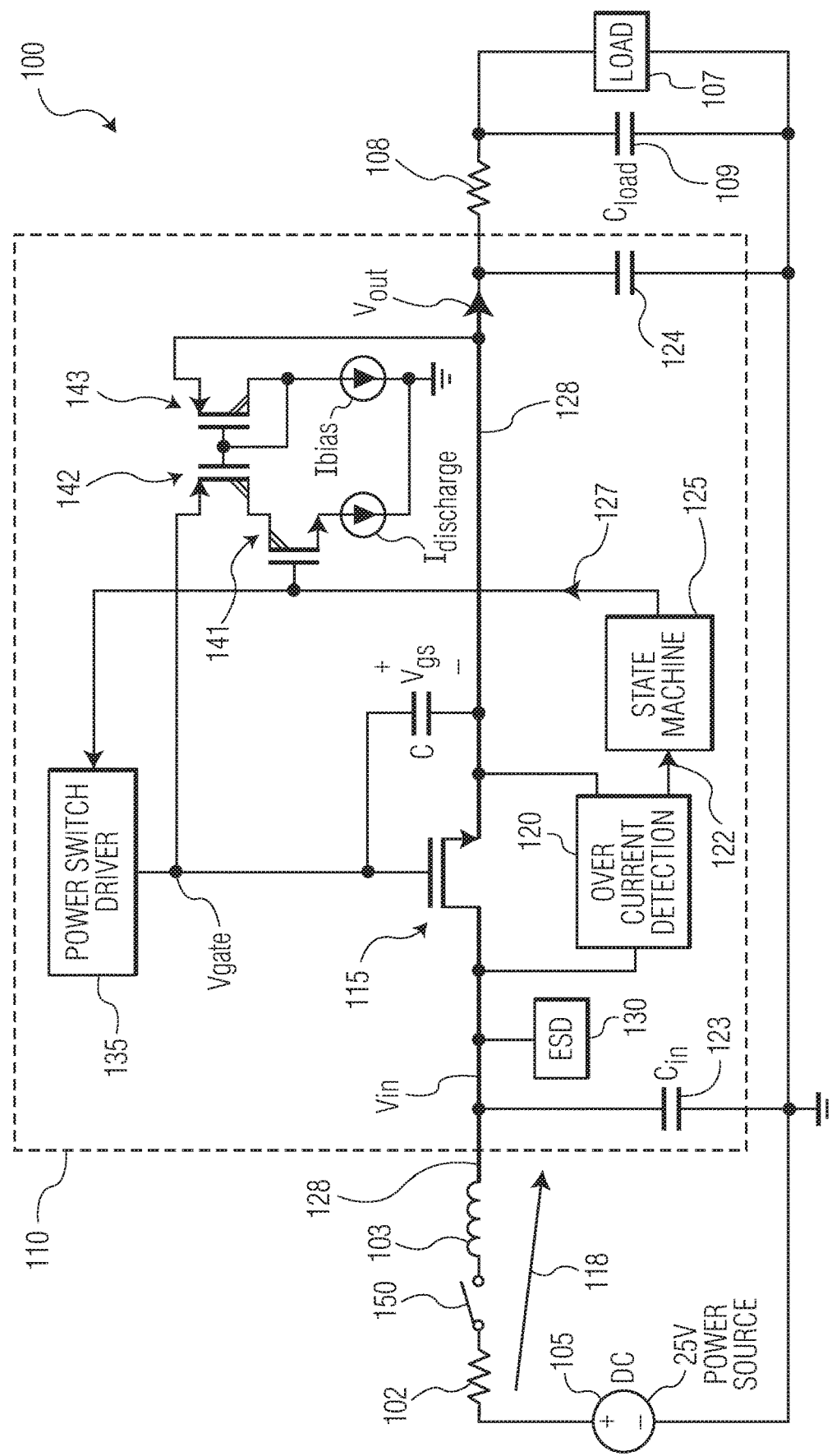
FIG. 1 illustrates a power delivery system in accordance with embodiments described herein.
Figure 2A:
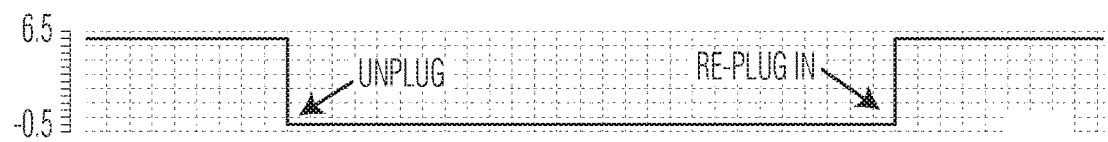
FIGS. 2A-2F illustrate simulation results in the power delivery system of the OCP circuit with hard shutdown in accordance with FIG. 1.
Figure 2B:
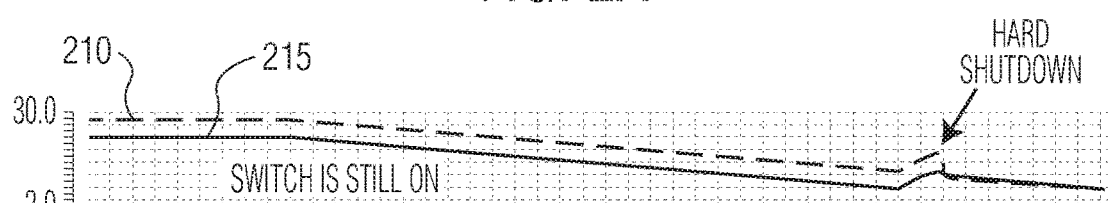
Figure 2C:
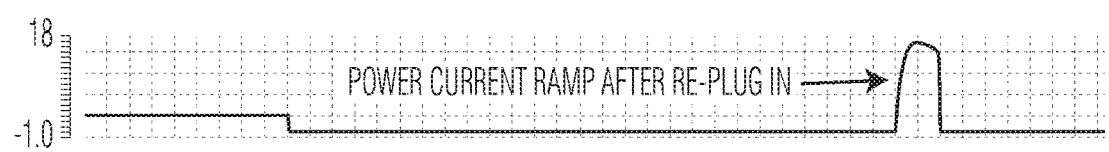
Figure 2D:
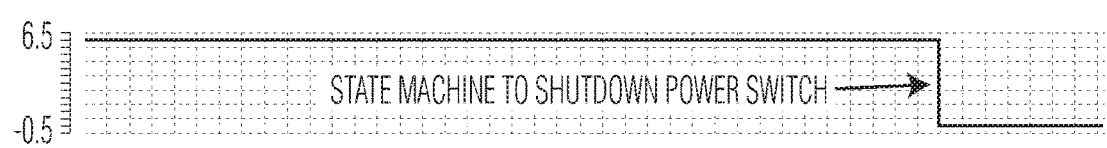
Figure 2E:
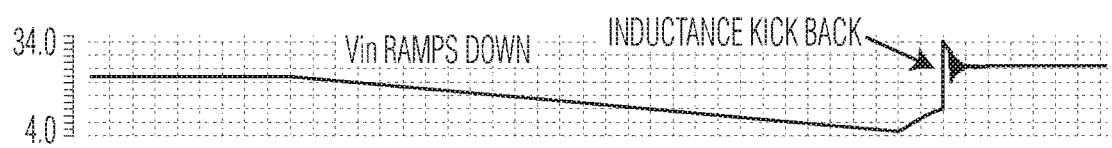
Figure 2F:
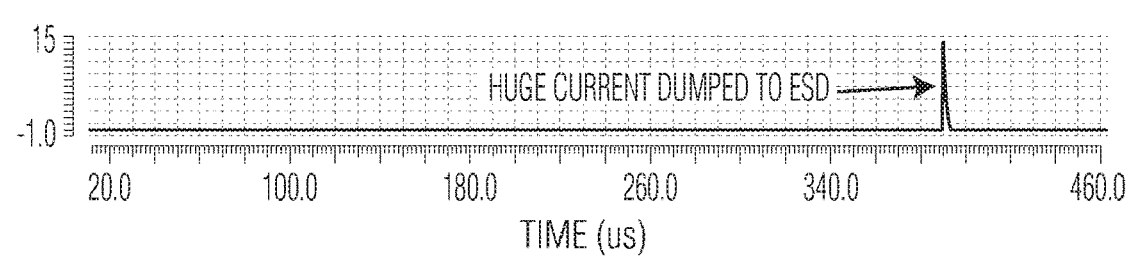
Figure 3A:
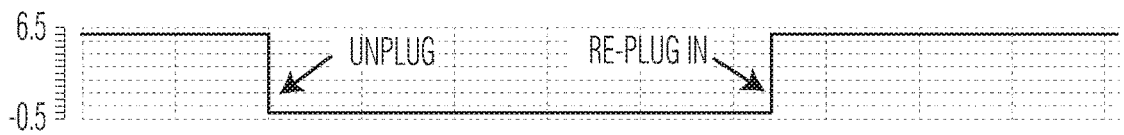
FIGS. 3A-3F illustrate simulation results in the power delivery system of the OCP with soft shutdown in accordance with FIG. 1.
Figure 3B:
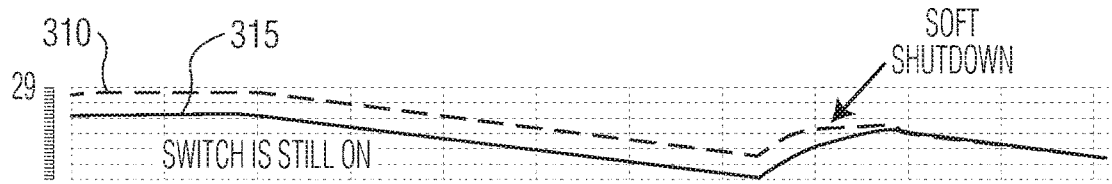
Figure 3C:
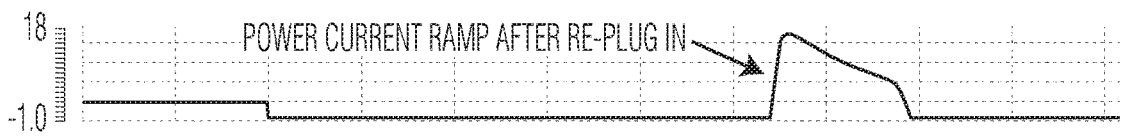
Figure 3D:
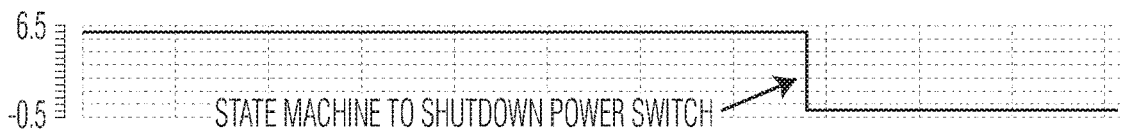
Figure 3E:
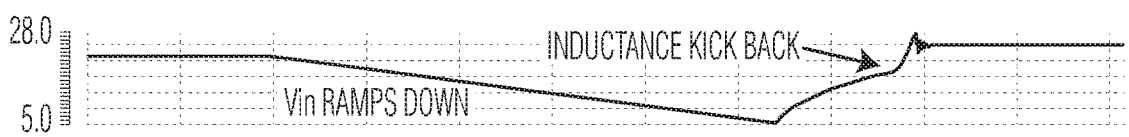
Figure 3F:
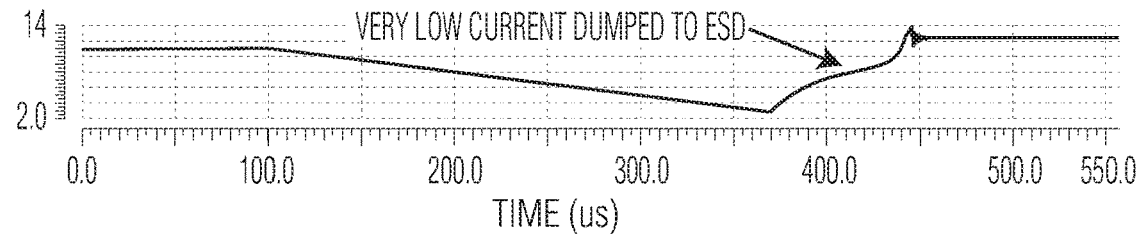

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or illustrated herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

According to embodiments described herein, in order to protect a power switch transistor system from being damaged by cable inductive kick back, a soft shutdown mechanism is presented to control the shutdown of the power switch transistor. Therefore, a power current decreasing rate is controlled and decreased to reduce inductive kick back.

In USB (universal serial bus) power delivery systems, power switch transistors are designed to control delivery of steady state current from a power source (e.g., wall plug) to loads (e.g., phone/tablet/laptop). In most cases, long trace lines or USB cables exist from the power source to a power switch transistor of the load. Protection circuits, like over current protection, may be designed to detect over current events and shut down the power switch transistor to protect loads, like cell phone, tablet, computer, etc. In some designs, during a transient of shutdown, power current decreases at a very fast rate of a few Amperes per micro second. This can result in huge inductive kick back from the trace line or USB cable to the drain side of a power switch transistor. The energy of the inductive kick back can be high enough to damage a power switch system of the power switch transistor and other circuits connected to the drain side of the power switch transistor like electrostatic discharge (ESD) protection circuits.

FIG. 1 illustrates a power delivery system 100 in accordance with embodiments described herein. The power delivery system 100 includes a power source 105, a power switch system 110 and a load 107. The power source 105, such as a wall plug or mobile charger, may connect to the power switch system 110 through an input wire or cable 128, and supply a power current 118. The power current 118 may be a battery charging current. The input cable 128 may have a resistance 102 and inductance 103 associated therewith. A control switch 150 may represent the ability of the power source 105 to be disconnected and connected to the power switch system 110, mimicking a behavior of a user that repeatedly unplugs and plugs a USB port to the power source 105 via the cable 128. The power switch system 110 may connect to the load 107 through a wire 128, a load resistance 108 and in parallel with load capacitance 109.

The power switch system 110 may include an input capacitor 123, an output capacitor 124, an electrostatic discharge (ESD) protection circuit 130, and the power switch transistor 115. The power switch system 110 may be disposed adjacent an input terminal of the load 107 device, such as connected to a USB port of a laptop, mobile phone, personal computer, etc. The power switch transistor 115 may be driven by a power switch driver 135. To monitor against high current that may be generated by unplugging and plugging of a USB cable, the power switch transistor 115 may be monitored by an over current protection (OCP) circuit 120. The OCP circuit 120 may be designed on a same substrate of the power switch transistor 115 to protect the load 107. The OCP circuit 120 may be configured to be in parallel with the power switch transistor 115. If a current entering the power switch transistor 115 is determined to be above a predetermined threshold, the OCP circuit 120 gradually powers down the power switch transistor 115 to minimize a threat of inductive kick back on the wire 128. Energy kickback and inductive kickback of high voltages could damage circuits on the drain side of the power switch transistor 115, including the ESD protection circuit 130.

The power switch system 110 includes a system state machine 125 configured to receive an asserted or non-asserted signal from the OCP circuit 120. The system state machine 125 may be connected in series with the OCP circuit 120. Based on the asserted or non-asserted signal, the system state machine 125 may control an ON or OFF state of the power switch driver 135. The power switch system 110 may further include transistors 141, 142, and 143 to control a steady discharging action of the power switch transistor 115.

In the power delivery system 100, in a steady state, the power current 118 at the level of a few Amperes, e.g., 3 Amperes, may be delivered from the power source 105 to the load 107 via the power switch transistor 115.

During a fault event, when the power current 118 is higher than a predetermined current threshold of the OCP circuit 120, e.g., 5 A or higher, the OCP circuit 120 triggers an over current event. When this occurs, a system state machine 125 may hard shut down the power switch transistor 115 after a predetermined delay time, in which to avoid a false detection event or glitch.

During transients of the shutdown of the power switch transistor 115, all of the cables 128 have inductance and capacitance, due to the inductance in the cable segments 128 on both sides of the power switch transistor 115. A 5 A current flowing through the power switch transistor 115 does not instantly drop to 0 A though it will eventually settle from 5 A to 0 A depending on the cable 128 inductance and power switch transistor 115 capacitance. This may be referred to as inductance kick and when the power switch transistor 115 is hard shutdown in less than few nano seconds. In this state, all of the 5 A will flow into a power switch transistor ESD protection circuit 130 for tens of micro seconds causing the ESD protection circuit 130 to be damaged. During the system state machine 125 debouncing delay time, over current may continue to increase to higher than 5 A. The energy stored in the cable 128 parasitic inductance is U=(½)*L*I$^2$, where L is the parasitic inductance of the 128, and I is the power current.

As illustrated in FIG. 1, in steady state, a power switch driver 135 is enabled to generate an output voltage Vgate to bias the power switch transistor 115 according to the following equation:

$$V_{gate} = V_{out} + V_{gs}, \quad (1)$$

where $V_{out}$ is the output voltage of the power switch transistor 115, and $V_{gs}$ is the pre-defined value to bias the power switch transistor to have a small on-resistance $R_{dson}$, such that $$R_{dson} = 1/[\mu_n * C_{ox} * (W/L)(V_{gs} - V_{thn})], \quad (2)$$

where $\mu_n$ is the mobility of the power switch transistor 115, and $C_{ox}$ is the gate oxide capacitance per unit area of the power switch transistor 115. W and L are the channel width and channel length of the power switch transistor 115 respectively, and $V_{thn}$ is a threshold voltage for power switch transistor to turn on. W/L is pre-defined to be very large, and $V_{gs}$ is pre-defined to be much higher than $V_{thn}$ to guarantee low $R_{dson}$ value.

Equations (1) and (2) illustrate that in steady state normal operation, when the power switch driver 135 is enabled, the power switch transistor 115 is turned on with very small on-resistance. Power current 118 is delivered from the power source 105, via cable or trace line 128, and power is switched to the load 107 with very low voltage drop across the power switch transistor 115. In normal operation condition the power current 118 is within a certain range, e.g., 3 A, and an over current detector output 122 is de-asserted. Therefore a system state machine output 127 is also de-asserted. Because the system state machine output 127 is de-asserted, the NMOS transistor 141 is turned off while the power switch driver 135 is enabled.

In a fault event, when power current 118 is higher than pre-defined level set in the OCP circuit 120, e.g., 5 A, the over current detector output 122 is asserted, and system state machine output 127 is asserted after a pre-defined value of debouncing delay time to avoid false alarm. A gate of the NMOS transistor 141 receives an input from the system state machine 125. NMOS transistor 141 may be referred to as a first discharge transistor. PMOS transistors 142 and 143 are set up in a current mirror configuration. When the system state machine output 127 is asserted, the power switch driver 135 is disabled, and a gate voltage of discharge transistor 141 is driven high by the system state machine 125, and the discharge transistor 141 is enabled. A drain of the PMOS transistor 142 is connected to a drain of the discharge transistor 141. A source of the PMOS transistor 142 connects to $V_{gate}$. When the discharge transistor 141 is enabled, the PMOS transistor 142 turns on and the current source $I_{discharge}$ starts to discharge a parasitic capacitance of the power switch transistor 115 through a source of the discharge transistor 141. The PMOS transistors 142 and 143 act as a current mirror to isolate the input voltage $V_{gate}$ from the output voltage $V_{out}$. Current through the PMOS transistor 143 may be denoted $I_{bias}$. The gate voltage $V_{gate}$ of the power switch transistor 115 starts to decrease as the power switch transistor 115 shuts down in a soft manner. The decreasing rate of the power switch transistor 115 gate voltage can be calculated by the following equation, $$dV_{gate}/dt = I_{discharge}/C, \quad (3)$$

where $I_{discharge}$ is the discharge current, and C is the parasitic capacitance of the power switch transistor 115. Equation (3) illustrates that by reducing the discharge current, the decreasing rate of power switch transistor 115 gate voltage $V_{gate}$ is reduced and shut down in a soft manner, and in turn, the decreasing rate of the power current 118 is decreased. As a result, a kick back voltage from the cable or trace line 128 becomes smaller according to the following equation, $$V_{inductance} = L*(dI_{power}/dt), \quad (4)$$

where $V_{inductance}$ is the kick back voltage from the parasitic inductance of the cable or trace line 128, and L is the parasitic inductance of the cable or trace line 128. $I_{power}$ is the power current 118. Because the decreasing rate of the power current 118 is decreased, the kick back voltage from the parasitic inductance of the cable or trace line 128 is decreased and damage of the power switch system 110 from kick back voltage is avoided. From another point of view, because the power switch transistor 115 is shut down in a slow or soft manner, energy stored in the cable 128 parasitic inductance has enough time to dissipate through the power switch transistor 115 to the load 107, which has a high capability of energy dissipation.

The delivery power voltage can be as high as 25V, and therefore NMOS transistor 141, PMOS transistor 142, PMOS transistor 143, and the power switch transistor 115 may use extended-drain devices to tolerate the high voltage of 25V. Extend-drain CMOS (NMOS and PMOS) devices are CMOS devices with extended drain oxide regions to increase a voltage tolerance between the drain and gate ($V_{dg}$) and between the drain and source ($V_{ds}$), but without increasing voltage tolerance between the gate and source ($V_{gs}$). The voltage tolerance on $V_{dg}$ and $V_{ds}$ of an extend-drain CMOS may be as high as 30V, but the voltage tolerance of $V_{gs}$ may only be 7V.

The control switch 150 may be used to mimic a wiggling (plug-unplug iteration) of the cable 128 to the power source 105. During the steady state that the cable 128 is plugged into the power source 105, and power switch transistor 115 is ON and the power is delivered from the power source 105 to the load 107, the customer may unplug the cable from the power source 105, and $V_{in}$ and $V_{out}$ voltage may start to ramp down from 25V, while the power switch transistor 115 is still ON. Before $V_{in}$ and $V_{out}$ ramp down to a few volts, a customer may re-plug in the cable 128 to the power source 105, then $V_{in}$ may ramp up and because of the high load capacitance of $C_{load}$, the power current 118 through the power switch transistor 115 may ramp up higher than 5 A, and trigger the OCP circuit 120 to shut down the power switch transistor 115.

FIGS. 2 and 3 illustrate simulation results in the power delivery system 100 of the OCP circuit 120 with hard shutdown and soft shutdown respectively in accordance with FIG. 1. Graph A represents a timing diagram of a control switch 150 control for power cable 128 being unplugged and plugged back in. Graphs B through F represent measurements at different stages in the power switch system 110 for different components thereof. In graph B, line 210 represents the gate voltage $V_{gate}$ and line 215 represents an output voltage $V_{out}$. When a power line cable 128 is unplugged, the gate voltage 210 and output voltage 215 begin to decrease. In graph C, when a power line cable 128 is plugged back in, in a hard shutdown system, the voltages 210 and 215 spike up sharply, and the power current 118 ramps up.

$V_{in}$ and $V_{out}$ voltage may start to ramp down from 25V, then back up in a sharp manner. In graph D, the power switch transistor 115 is still ON when the power that is in OCP circuit 120 experiences hard shutdown by the system state machine 125. In graph E, after the re-plug-in, a sharp and huge inductance kick back is observed. In graph F a huge current may be dumped to ESD protection circuit 130 such that the ESD protection circuit 130 is damaged.

In FIG. 3, graph A represents a timing diagram of a control switch 150 for power cable 128 being unplugged and plugged back in. Graphs B through F represent measurements at different stages in a power switch system 110 for different components thereof. In graph B, line 310 represents the gate voltage $V_{gate}$ and line 315 represents an output voltage $V_{out}$. When a power line 128 is unplugged, the gate voltage 310 and output voltage 315 begin to decrease. In graph C, when the power line 128 is plugged back in, in a soft shutdown system, the voltages 310 and 315 gradually increase.

$V_{in}$ and $V_{out}$ voltages may start to ramp down from 25V then back up in a soft manner. In graph D, the power switch transistor 115 is still ON when the power that is in OCP circuit 120 experiences soft shutdown by the system state machine 125. In graph E, after the re-plug-in, the inductance kick back is very small. In graph F a very small current may be dumped to ESD protection circuit 130 such that the ESD protection circuit 130 is protected.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A power switch over current protection system, comprising:
   a power switch transistor configured to deliver a power current from a power source to power load;
   a power switch driver configured to control and on/off state of the power switch;
   an over current protection (OCP) circuit to detect a threshold value of the power current;
   a discharge transistor configured to discharge a parasitic capacitance of the power switch transistor by decreasing a voltage at a gate of the power switch transistor to a voltage at a source of the power transistor; and
   a system state machine to receive a signal from the OCP circuit configured to control an action of the power switch driver and discharge transistor depending on the level of the power current;
   wherein the power switch transistor is configured to soft shut down in response to plugging and unplugging of a power cable to reduce kick back voltage from inductance in the power cable.

2. The system of claim 1, wherein the OCP circuit triggers an over current event when the power current is higher than a predetermined threshold.

3. The system of claim 1, wherein the system state machine is configured to soft shut down the power switch transistor when the power current is higher than a predetermined threshold.

4. The system of claim 3, further comprising:
   an electrostatic discharge (ESD) protection circuit disposed between the power source and the power switch transistor, wherein the soft shutting down of the power switch transistor protects the ESD protection circuit.

5. The system of claim 1, wherein the system state machine turns on the discharge transistor and turns off the power switch driver when the power current is higher than a predetermined threshold.

6. The system of claim 5, wherein the system state machine turns off the discharge transistor and turns on the power switch driver when the power current is lower than a predetermined threshold.

7. The system of claim 1, wherein the over current protection circuit is in parallel with the power switch transistor.

8. The system of claim 1, wherein the system state machine is in series with the over current protection circuit.

9. The system of claim 1, wherein the power switch transistor is an extended drain transistor.

10. The system of claim 1, wherein the discharge transistor is an extended drain transistor.

11. The system of claim 1, comprising a current mirror configured to isolate a gate voltage of the power switch transistor from an output voltage of the power switch transistor.

12. The system of claim 11, wherein one transistor of the current mirror is directly connected to the gate of the power switch transistor.

13. A method, comprising:
   detecting a charging current entering a power switch transistor;
   determining whether a level of the charging current exceeds a predetermined threshold;
   signaling to a system state machine by an over current protection circuit a status of the charging current;
   turning on a discharge transistor when the charging current exceeds the predetermined threshold; and
   soft shutting off a power switch transistor to protect electronic circuits that are connected to the power switch transistor by decreasing a voltage at a gate of the power switch transistor to a voltage at a source of the power transistor, wherein the power switch transistor is configured to soft shut down in response to unplugging and plugging of a power cable to reduce kick back voltage from inductance in the power cable.

14. The method of claim 13, wherein a decreasing rate of a gate voltage of the power switch transistor is calculated by the equation $dV_{gate}/dt = I_{discharge}/C$, where Idischarge is a discharge current, and C is a parasitic capacitance of the power switch transistor.

15. The method of claim 13, comprising switching on a discharge transistor while switching off a power switch driver that drives the power switch transistor.

16. The method of claim 13, comprising controlling an on state of a power switch transistor using a power switch driver.

17. The method of claim 16, comprising controlling an on state of the power switch driver using the system state driver.

18. The method of claim 13, wherein the protected electronic circuits include an ESD protection circuit.

19. The method of claim 13, wherein a gate voltage of the power switch transistor is isolated from an output voltage of the power switch transistor using a current mirror.

20. The system of claim 1, wherein the power switch transistor is an NMOS transistor.

21. The method of claim 13, wherein the power switch transistor is an NMOS transistor.

22. The system of claim 1, comprising a PMOS current mirror to discharge the parasitic capacitance across the source and gate of the power switch transistor, the PMOS current mirror having a first PMOS transistor and a second PMOS transistor, a source of the first PMOS transistor coupled to the gate of the power switch transistor and a source of the second PMOS transistor coupled to the source of the power switch transistor.

23. The system of claim 1, wherein the voltage at the gate of the power switch transistor is held substantially at the voltage at the source of the power switch transistor to turn off the power switch transistor.

* * * * *